United States Patent [19]

Bereskin

[11] Patent Number: 5,083,088

[45] Date of Patent: Jan. 21, 1992

[54] MICROWAVE TEST FIXTURES FOR DETERMINING THE DIELECTRIC PROPERTIES OF A MATERIAL

[76] Inventor: Alexander B. Bereskin, 452 Riddle Rd., Cincinnati, Ohio 45220

[21] Appl. No.: 558,063

[22] Filed: Jul. 24, 1990

[51] Int. Cl.⁵ ............................................. G01R 27/04
[52] U.S. Cl. .................................... 324/632; 324/636; 324/642; 324/639
[58] Field of Search ............... 324/632, 636, 633, 634, 324/639, 642

[56] References Cited

U.S. PATENT DOCUMENTS

| | | | |
|---|---|---|---|
| 3,401,333 | 9/1968 | Thompson | 324/632 |
| 3,510,764 | 5/1970 | Heath | 324/633 |
| 3,559,043 | 1/1971 | Hyde | 324/636 |
| 3,942,107 | 3/1976 | Gerhard | 324/633 |
| 4,277,741 | 7/1981 | Faxvog et al. | |
| 4,453,125 | 6/1984 | Kimura et al. | |
| 4,507,602 | 3/1985 | Aguirre | |
| 4,581,574 | 4/1986 | Goodman et al. | |
| 4,801,862 | 7/1989 | Osaki et al. | |
| 4,829,233 | 5/1989 | Flemming | 324/632 |
| 4,866,370 | 9/1989 | Fleming et al. | |
| 4,866,371 | 9/1989 | De | |
| 4,952,916 | 8/1990 | Taplin | 324/633 |

OTHER PUBLICATIONS

IRE MTT, Jul. 1954, "Characteristic Impedance of the Shielded-Strip Transmission Line", by Seymour B. Cohn, pp. 52-57.

Primary Examiner—Kenneth A. Wieder
Assistant Examiner—Jose M. Solis
Attorney, Agent, or Firm—Wood, Herron & Evans

[57] ABSTRACT

A method for determining the dielectric properties of a test material using a housing with an electrically shielded cavity defined therein to hold test material that surround an electrical conductor. Input and output circuits for coupling microwave energy into and out of the electrical conductor in the cavity are provided, each circuit having a transmission line having a center conductor extending through the housing with a tapping mechanism midstream of the conductor for coupling energy from the center conductor of the input circuit into the electrical conductor and from the electrical conductor to the center conductor of the output circuit. The tapping mechanisms are adjustable to vary the coupling of microwave energy with respect to the electrical conductor. By using power measuring equipment having a characteristic impedance which matches that of the transmission line(s), the line(s) will be flat between the tapping mechanism and the power measuring equipment thus allowing power measurements without use of directional couplers and/or SWR meters.

11 Claims, 7 Drawing Sheets

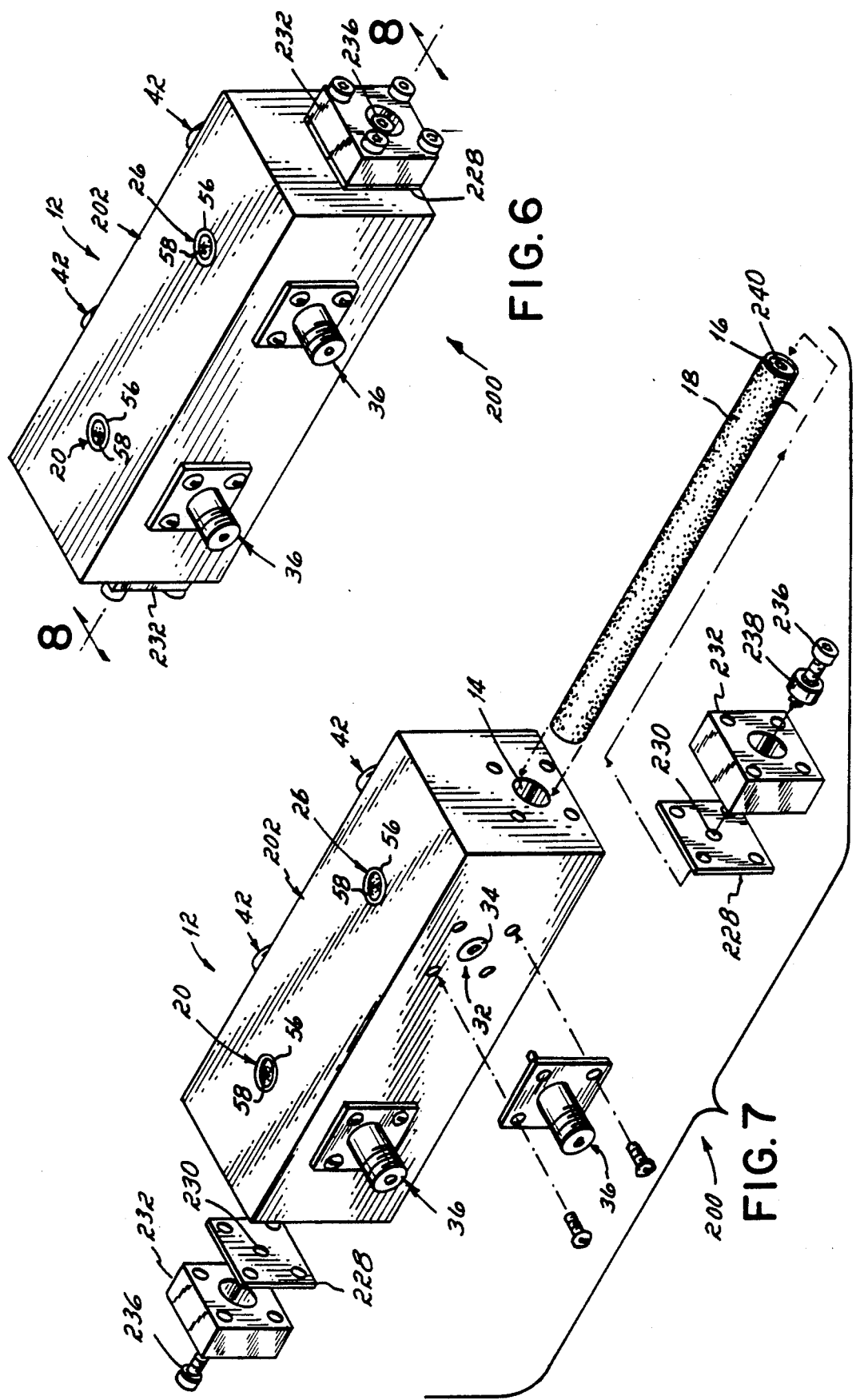

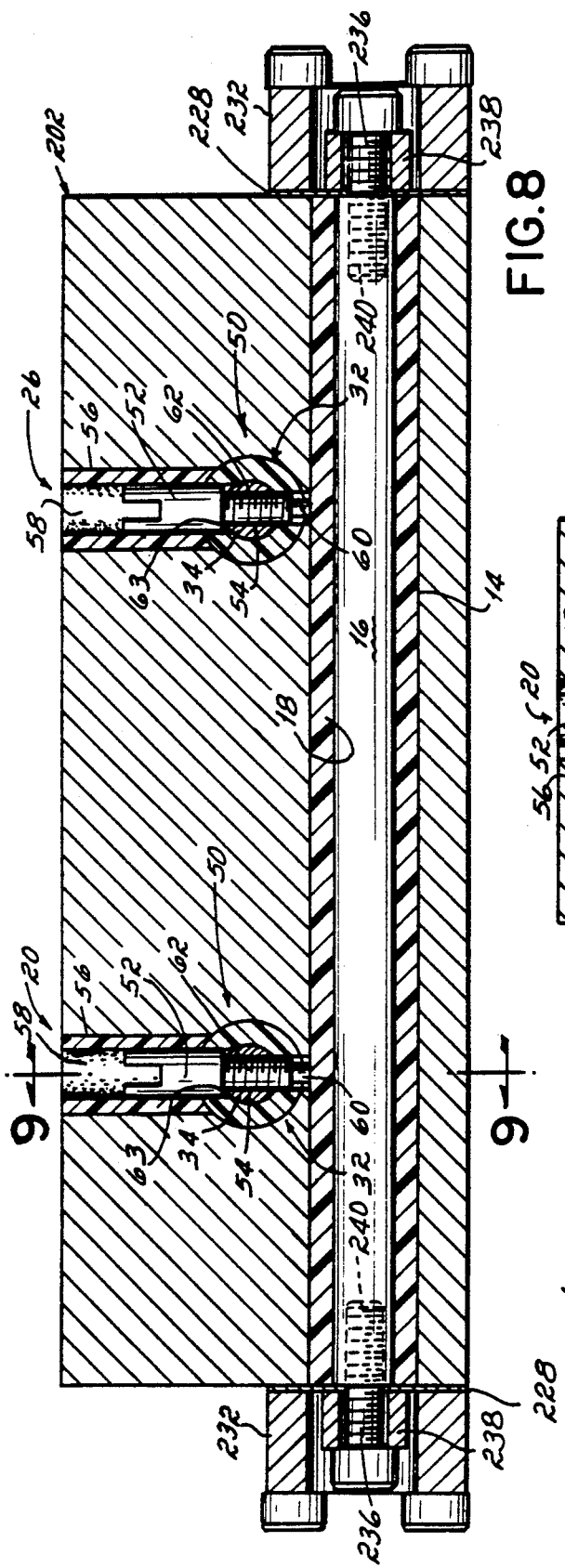
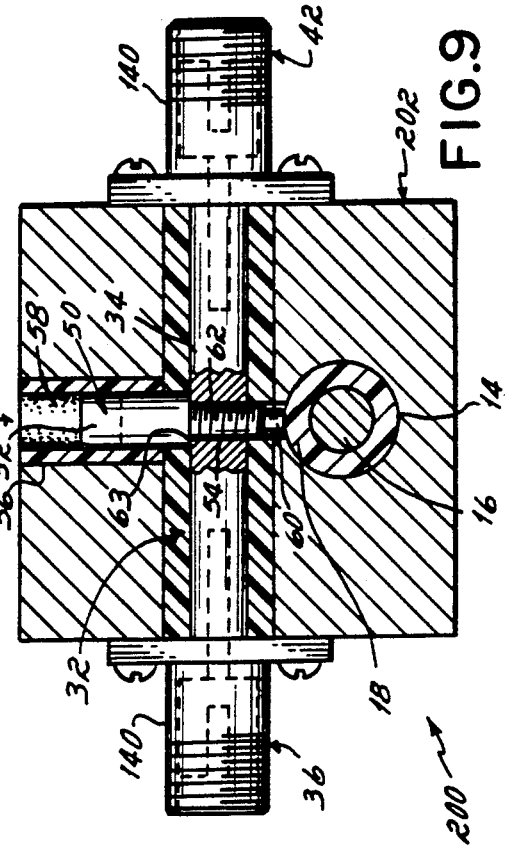

MICROWAVE TEST FIXTURES FOR DETERMINING THE DIELECTRIC PROPERTIES OF A MATERIAL

BACKGROUND OF THE INVENTION

I. Field of the Invention

The present invention relates to test fixtures for determining dielectric properties of a material, and more particularly, to such test fixtures for making such determinations at microwave frequencies.

II. Description of the Prior Art

By way of background, some known test fixtures for determining dielectric properties of a test material at microwave frequencies input microwave energy into one end of an electrical conductor at least partially surrounded by the test material and provide an output for that energy at another end of the surrounded conductor. From power measurements made of the microwave energy input to and output from the surrounded conductor, various dielectric properties of the surrounding test material may be determined.

One drawback with a typical test fixture is that measurement of the input microwave energy requires use of additional equipment such as directional couplers and standing wave reflection (SWR) meters. A further drawback to such a test fixture is the limited range of microwave frequencies over which testing can be obtained.

As is well understood, the input frequency of the microwave energy is varied to locate resonant spectral points and harmonics thereof. The −3 db, or half-power, points about these spectral points of interest are then recorded and used for determining the dielectric properties of the test material. The more spectral points of interest about which measurements can be taken, the more verifiable the dielectric determinations. In order to increase the input range of typical test fixtures, the test material may have to be removed to allow the test fixture to be altered structurally or even replaced. Such changes during testing degrade the reliability and repeatability of the dielectric determinations.

SUMMARY OF THE INVENTION

The present invention provides a test fixture for determining dielectric properties of a test material at microwave frequencies without such drawbacks. To this end, and in accordance with the principles of the present invention, the test fixture includes a cavity for retaining the test material about a conductor extending through the cavity and an input circuit having a transmission line with a center conductor spaced from and extending transverse the electrical conductor in the cavity, and with a tapping member midstream of the transmission line center conductor to couple microwave energy into one end of the surrounded conductor. Microwave energy may be input into one end of the transmission line and coupled to the test conductor via the tapping members. When a power measurement device having a characteristic impedance equal to the characteristic impedance of the transmission line is connected to the other end of the transmission line, the line is flat such that power measurements taken at that other end are directly related to power coupled from the input circuit tapping mechanism without the need for directional couplers and SWR meters.

Preferably, an output circuit is provided, which is identical to the input circuit but with the tapping member in the transmission line of the output circuit positioned to couple energy from the other end of the surrounded conductor. In accordance with another aspect of the present invention, the tapping mechanisms in the input and output circuits each provide a variable length electrically conductive member by which to effectively vary the capacitance coupling between the transmission line center conductor in both circuits to the conductor within the cavity so as to vary the amount of energy coupled to and from the test conductor. Preferably, the conductive members are screws threadably mounted within the transmission line center conductor of each circuit such that rotation of the screws moves the distal ends thereof towards and away from the cavity. The variable length taps thus allow for adjustment of the coupling of the input and output circuits at various frequencies so as to extend the range of frequencies over which the test set-up of the present invention may be used by a factor of at least 10 to 1 and possibly as much as 40 to 1 or more.

In accordance with a yet further aspect of the present invention, I have determined that measurements are more reliable and repeatable when the difference between energy input to and output from the conductor in the cavity is at least 40 db. Therefore, and in accordance with the present invention, a method for determining the dielectric properties of the test material includes finding the resonant frequency and then varying the coupling of the input and output circuits, preferably by equal amounts, until at least a 40 db power difference is attained between the input and output power levels. With the input power level held constant, the input frequency is then adjusted to find the −3 db and −6 db points on either side of the resonant frequency. The above procedure is repeated at approximately integral multiples of the resonant frequency over a wide range of frequencies, each time by simply adjusting the tapping mechanisms without other alterations to the test set-up. Thus, many spectral points can be tested to produce more reliable dielectric property determinations.

By virtue of the foregoing, there is provided a test fixture for measuring the dielectric properties of a material at microwave frequencies without directional couplers and SWR meters for measuring input power and which may be used over a wide range of frequencies to obtain reliable and repeatable data without structurally altering or replacing the test fixtures.

These and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with the general description given above, and the detailed description of the embodiments given below, serve to explain, the principles of the invention.

FIG. 6 is a perspective view of another embodiment of a test fixture in accordance with the principles of the present invention;

FIG. 7 is an exploded view of the test fixture of FIG. 6;

FIG. 8 is a view along line 8—8 of FIG. 6; and

FIG. 9 is a view along line 9—9 of FIG. 8.

DESCRIPTION OF THE PREFERRED EMBODIMENT

Figure 1:
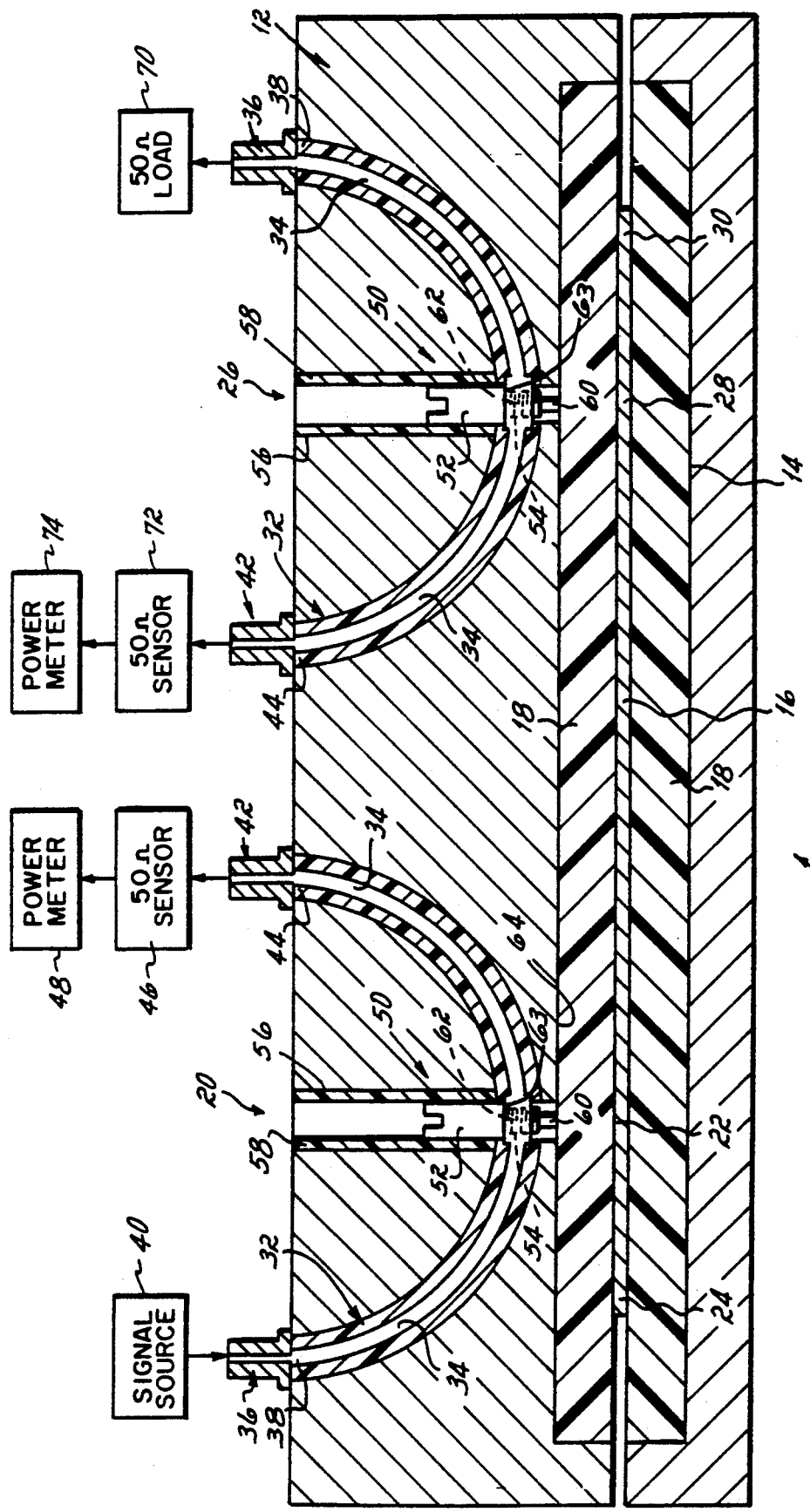
FIG. 1 is a schematic representation of a test fixture for explaining the present invention.
Figure 2:
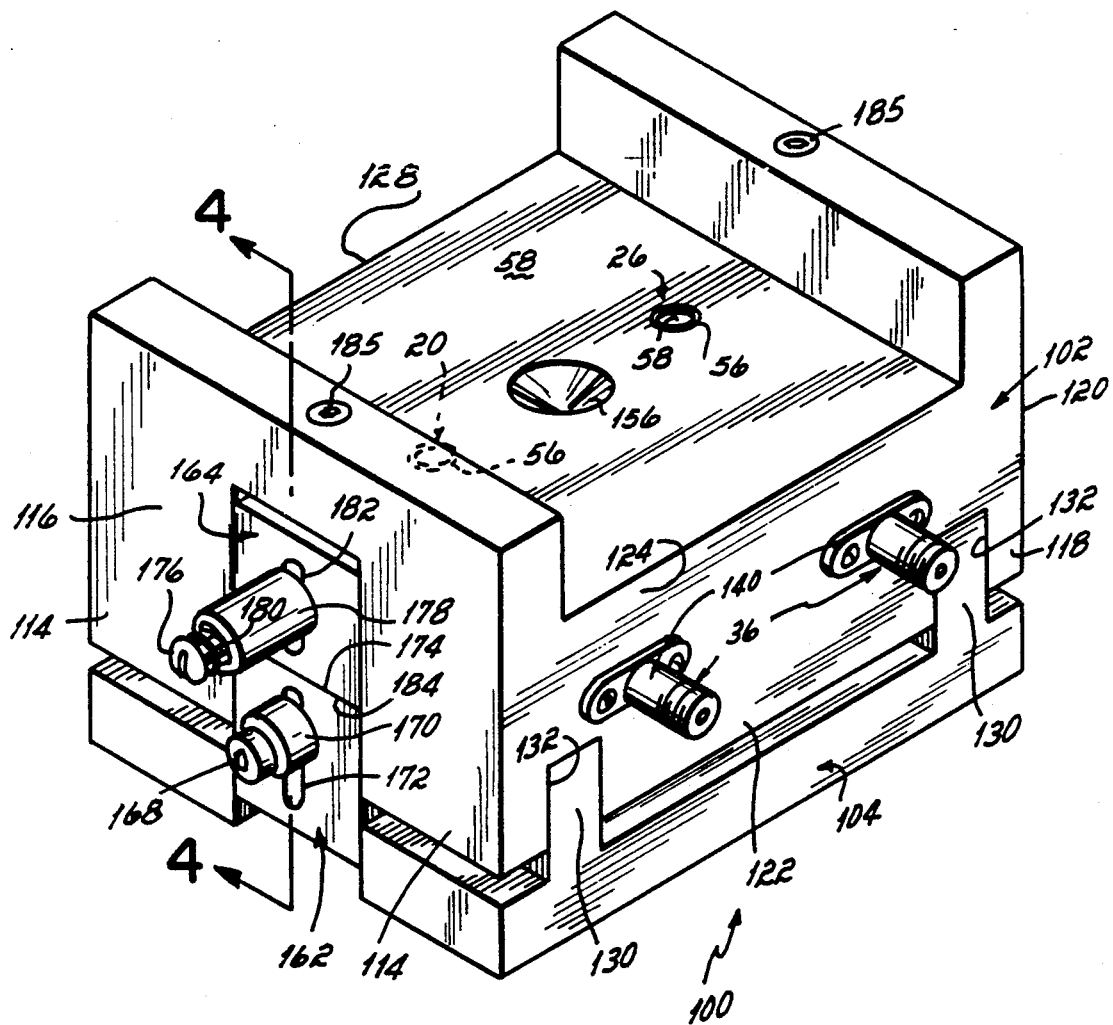
FIG. 2 is a perspective view of one embodiment of a test fixture in accordance with the principles of the present invention.
Figure 3:
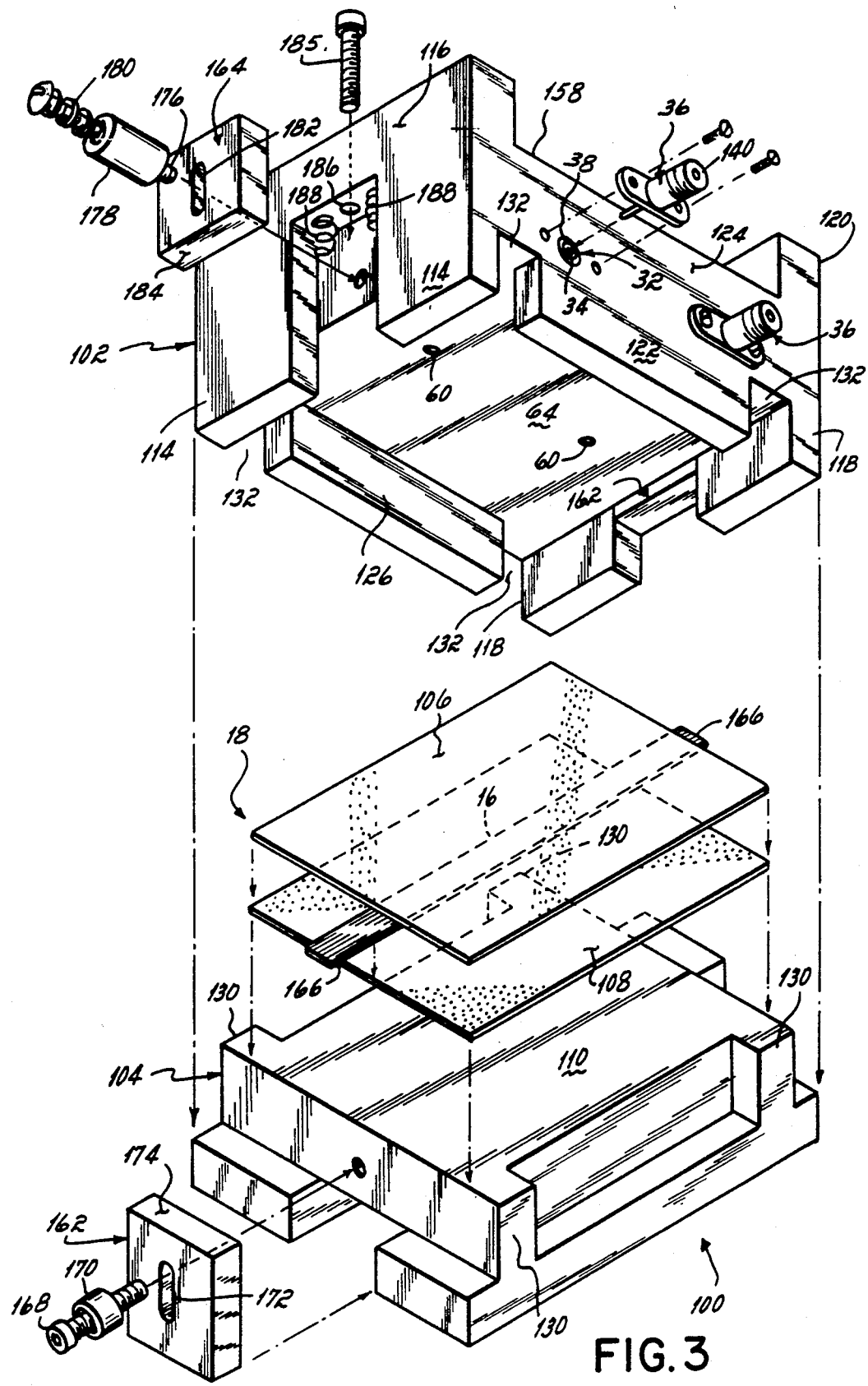
FIG. 3 is an exploded view of the test fixture depicted in FIG. 2.

With reference to FIG. 1, there is shown a schematic representation of a test fixture 10 for explaining the present invention. Fixture 10 includes an aluminum block housing 12 with an electrically shielded cavity 14 defined therein. Contained within cavity 14 is a conductive element 16 surrounded by the dielectric test material 18. An input or excitation circuit 20 is provided for coupling microwave energy into a first location 22 coincident with element 16 adjacent one end 24 thereof and for measuring the power thereat. Similarly, an output circuit 26 is provided for measuring microwave power at a second location 28 remote from first location 22 and coincident with element 16 adjacent the other end 30 thereof.

Input circuit 20 includes a transmission line 32 having a center conductor 34 extending through housing 12. A connector 36 provides a port at one end 38 of transmission line 32 for coupling microwave energy from variable frequency microwave signal source 40 to center conductor 34. A connector 42 provides a port at the other end 44 of transmission line 32 for coupling microwave energy out of center conductor 34. Coupled to connector 42 is a power sensor 46 and a power meter 48. Positioned midstream of transmission line 32 is a tapping mechanism 50 to couple microwave energy from center conductor 34 to cavity 14 at first location 22. Sensor 46 has a characteristic impedance equal to the characteristic impedance of transmission line 32 so as to render line 32 electrically flat between tapping mechanism 50 and sensor 46. As a result, power measurements at connector 42 are directly indicative of microwave energy coupled from tapping mechanism 50 at first location 22 without the use of directional couplers and SWR meters.

Tapping mechanism 50 includes electrically conductive screw 52 threadably mated with a tapped hole 54 defined through center conductor 34. Screw 52 is situated inside a bore 56 extending into housing 12 and communicating with cavity 14. Screw 52 is located between connectors 36, 42 so as to be along a line intercepting conductive element 16 when it is properly positioned in cavity 14, such that energy may be launched into cavity 14 from conductive screw 52 to first location 22. Preferably, bore 56 is provided with a Teflon-liner 58 to insulate screw 52 from conductive housing 12. The screw 52 may be rotated such that distal end 60 thereof may be moved towards or away from cavity 14 so as to vary the capacitance coupling between center conductor 34, and element 16 in cavity 14. The threaded portion 62 of screw 52 is preferably a #2-56 thread. Screw 52 has a shoulder 63 above threaded portion 62 that contacts the center conductor 34 above tapped hole 54. The length of the threaded portion 62 of screw 52 is selected to prevent the further extension of screw 62 such that distal end 60 thereof will not extend below surface 64 and into cavity 14 when screw 52 is fully threaded into hole 54.

Output or detection circuit 26 is substantially identical to input circuit 20 except that output circuit 26 is located such that distal end 60 of screw 52 thereof couples microwave energy from second location 28 in cavity 14 to output circuit center conductor 34. Excitation and detection circuits 20, 26 are symmetrical and therefore interchangeable. Connector 36 of output circuit 26 may be coupled to a load 70, rather than a microwave source. Load 70 has a characteristic impedance equal to the characteristic impedance of transmission line 32 of output circuit 26. Connector 42 of output circuit 26 is coupled to a power sensor 72 having a characteristic impedance equal to the characteristic impedance of the transmission line 32 of output circuit 26 so that transmission line 32 is flat between tap 50 and sensor 72. Power sensor 72 is in turn coupled to power meter 74 which provides a direct reading of power at output circuit tapping mechanism 50. Power meters 48, 74 connected to the input and output circuits, respectively, may be HP 435B or the equivalent thereof, while input sensor 46 may be a 0 to 20 dbm power sensor such as an HP 8481A or equivalent and output sensor 72 may be a −30 to −50 dbm power sensor such as HP 8484A or equivalent. Signal generator 40 preferably provides at least 10 dbm at its output.

As shown in FIG. 1, the dielectric properties of test material 18 may be tested in an ungrounded mode. In the ungrounded mode, element 16 must not extend completely across cavity 14 but should be confined at each end within test material 18 by an amount at least equal to the electrical length extension of element 16 due to fringing fields. Alternatively, tests may be conducted in a grounded mode by extending element 16 beyond test material 18 and grounding element 16 at both ends to housing 12 as will be described hereinafter.

Due to the variable coupling of input circuit 20 and output circuit 26 to element 16 retained within cavity 14, the range of the frequency of the microwave energy input is quite expansive, such as greater than 10 to 1 and possibly as much as 40 to 1 or more, without requiring removal of test material from cavity 14. The variable coupling of the input and output circuits may also be utilized to obtain a predetermined minimum power differential between input and output power measurements as will be described.

To test material 18, the frequency of generator 40 is increased from an initial low frequency, preferably greater than about 600 MHz, as output circuit power meter 74 is monitored for a peak response that indicates a resonant frequency or a harmonic thereof. The output power of generator 40 is then adjusted until the needle on meter 74 is deflected full scale. While holding the input frequency at that frequency, tapping screws 52 are retracted preferably in unison and by equal amounts, such as approximately a quarter turn each, until a power difference of at least 40 db is noted. I have discovered that by maintaining such a predetermined power difference between input and output power levels at the frequency of interest, the resonant frequency and Q of element 16 are independent of the coupling to the input and output circuits. The frequency of source 40 is then decreased while keeping the input power constant at meter 48 until the frequencies where −3 db and −6 db power losses are noted on meter 74 and those frequencies are recorded. The input frequency is similarly increased to find the −3 db and −6 db points above the frequency of interest and these frequencies again recorded. The frequency of generator 40 is then increased until there is another peak response and the above procedure repeated. The procedure is repeated at each spectral point of interest throughout as broad a range of input frequencies as possible (such as to 20 GHz and higher) to provide additional data for verifying the test results. These measured frequencies are then used to compute the dielectric properties of test material 18. If the frequency meter (not shown) built into signal source 40 does not have sufficient accuracy, the measurement of the input frequency can be improved by connecting a directional coupler (not shown), such as a HP 11692D or equivalent, in series between source 40 and input circuit connector 36. An HP 5343A Frequency Counter (not shown) or equivalent is connected to the directional coupler to provide accurate frequency measurements over the 600 MHz to 20 GHz range.

The lowest resonant frequency ($f_o$) occurs at the one half wavelength of the electrical length of the stripline. The electrical length of the stripline is slightly greater than the physical length due to fringing fields at the tip and this must be taken into account to determine the true dielectric constant of the material. Additional resonant frequencies occur at integral multiples of this resonant frequency. The stripline may also resonate in a lateral mode and there may be unrelated spurious cavity modes all of which will be much higher than the lowest half wavelength mode. The lateral and spurious modes are recognized as data points that do not produce results consistent with the majority of spectral points of interest. These results are rejected.

The Q of a transmission line is $\pi/\alpha\lambda$ where $\alpha$ is the attenuation factor in nepers/meter and $\lambda$ is the wavelength in meters. This Q can be determined by means of the resonance curve bandwidth at either the $-3$ db or $-6$ db points. Both points are preferably used as a check on the resonance wave shape which may be distorted by spurious oscillations. In particular, $Q_{-3\,db} = f_o/-3\,db\,BW = Q_{-6\,db} = \sqrt{3}f_o/-6\,db\,BW$ where $f_o$ is the resonant frequency, $-3$ db BW is the frequency different between the $-3$ db points, and $-6$ db BW is the frequency difference between the $-6$ db points.

The total attenuation factor $\alpha$ of a transmission line is the sum of the effects of the metallic losses $\alpha_m$ and the dielectric losses $\alpha_3$ where $\alpha_m = R/2Z_o$ and $\alpha_d = GZ_o/2$. Here R is the transmission line resistance per unit length in ohms per meter, $Z_o$ is the characteristic impedance of the transmission line in ohms, and G is the transmission line conductance in Siemens per meter.

The value of $\alpha_m$ can be determined theoretically if all of the metallic path dimensions and resistivities are known or experimentally by using a low loss dielectric material and separating the metallic and dielectric losses on the basis of their different frequency relationships.

Figure 4:
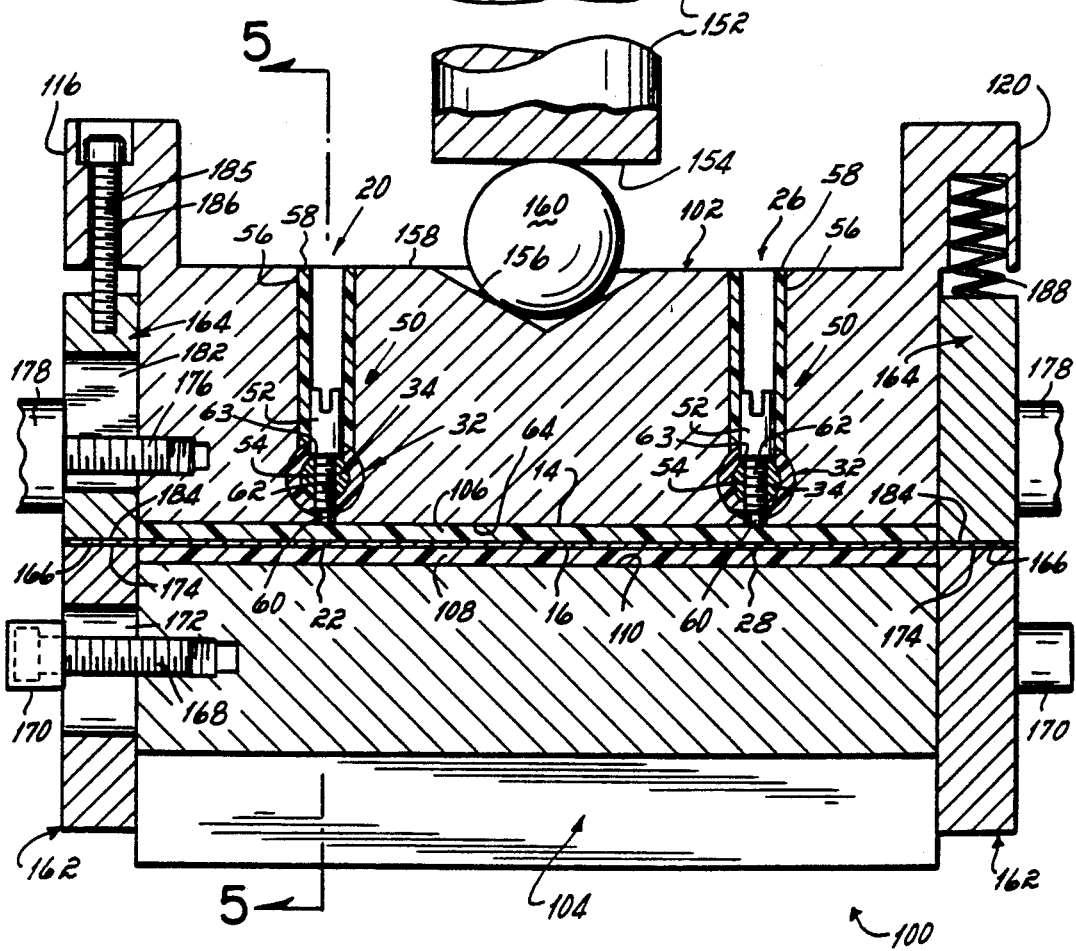
FIG. 4 is a view along line 4—4 of FIG. 2 with the test fixture in the clamped position.
Figure 5:
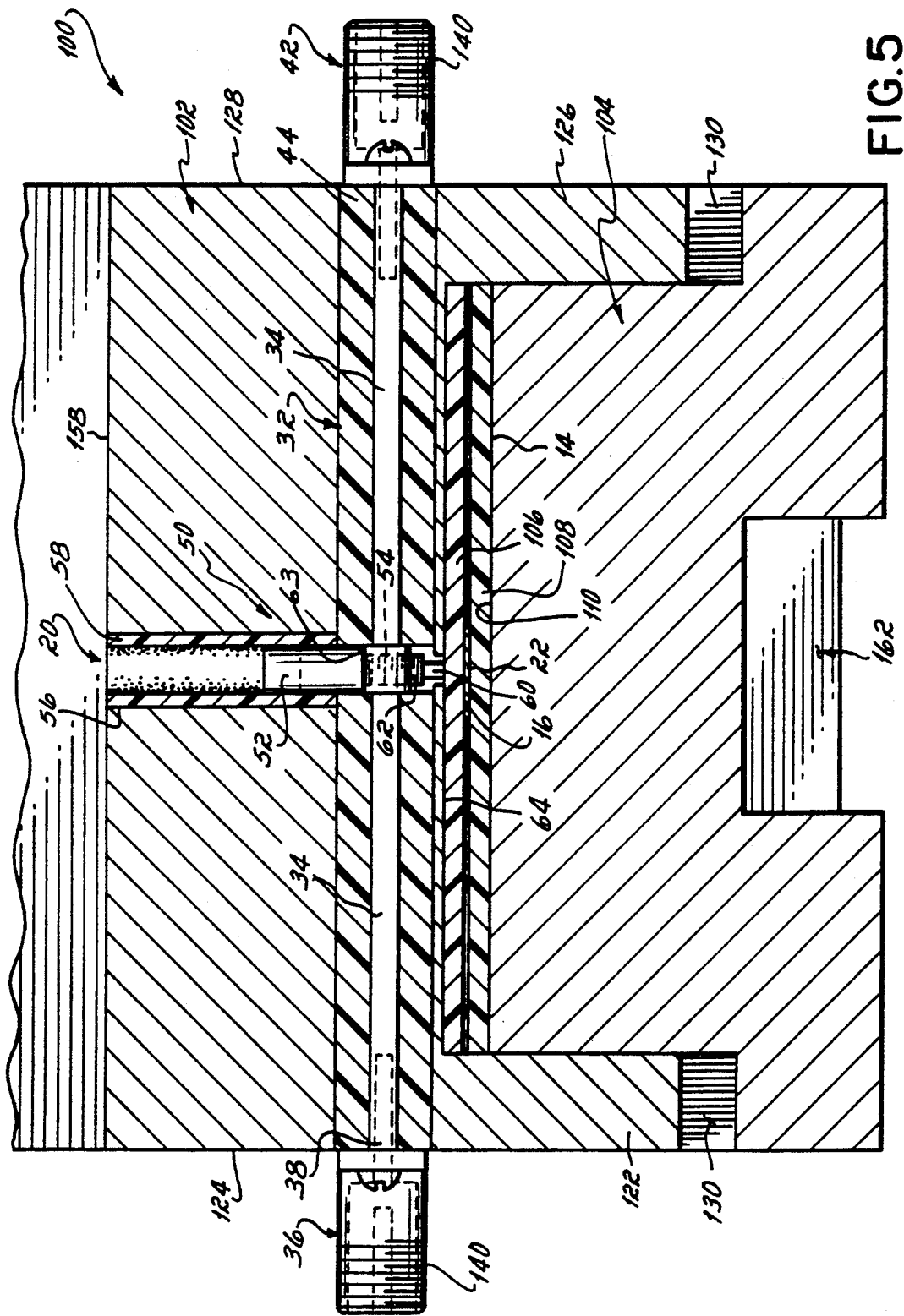
FIG. 5 is a view along line 5—5 of FIG. 4.

With reference to FIGS. 2-5, there is shown one embodiment 100 of a test fixture in accordance with the invention for testing sheet dielectric material 18 in a stripline configuration. To this end, housing 12 of embodiment 100 is defined by upper section 102 and lower section 104 which mate to define cavity 14 therebetween (FIGS. 4 and 5). Cavity 14 is rectangular in cross-section to retain therein a stripline arrangement of two sheets 106, 108 of dielectric test material 18 sandwiched about element 16 which in this embodiment is an electrically conductive flat strip of copper. Cavity 14 is defined between upper surface 110 of lower section 104, lower surface 64 of upper section 102, extensions 114 of front end 116, extensions 118 of rear end 120, extension 122 of left sidewall 124 and extension 126 of right sidewall 128, of upper section 102. Sheets 106, 108 are each dimensioned to fit snugly within cavity 14 parallel to surface 64 and surface 110. Lower sheet 108 is placed upon upper surface 110 of lower section 104 such that strip 16 is centered and extends lengthwise through cavity 14 generally between front extension 114 and rear extension 118. Sections 102 and 104 mate together such that shoulders 130 of lower section 104 are received with slots 132 of upper section 102. Sections 102 and 104 may be aluminum blocks rendering them conductive such that surfaces 64 and 110 define grounding planes for electrically shielding cavity 14. Surfaces 64, 110 could be rendered more conductive by copper either plated or epoxied to the housing. Also, while dielectric sheets 106, 108 are shown separate from strip 16, one or both of sheets 106, 108 could be copper clad on one or both sides with one side properly etched to define strip 16.

Center conductors 34 of input and output circuits 20, 26 extend between left and right sidewalls 124, 128 of upper section 102 such that the center conductors 34 are spaced above cavity 14 and transverse strip 16 in the cavity with screws 52 of tapping mechanism 50 each preferably being equidistant from associated connectors 36, 42 so as to overlie strip 16 properly centered in cavity 14. Connectors 36, 42 are mounted directly to sidewalls 124, 128, respectively, such that outer shells 140 of the connectors provide an electrical ground to section 102 as is well understood. Connectors 36, 42 are preferably SMA connectors, though any connectors capable of carrying microwaves along an insulated conductor contained within a grounding shield are sufficient.

To hold sections 102, 104 together, an arbor press 150 (FIG. 4) may be used with a flat surface on its anvil 152 as at 154. A V-shaped indent 156 is provided in upper wall 158 of section 102. Anvil 152 is mated to housing 12 via ball bearing 160 and is preferably provided with weights (not shown) or is otherwise manipulated to apply at least 1000 lbs. force against housing 12 and forcibly mate sections 102 and 104 sufficiently to expel air pockets in the stripline.

While the dimensions of element 16 are not critical themselves, they must be precisely known to determine the dielectric properties of the test material. Preferably, a strip having a width of 0.250" and a thickness of 0.002" is used in test fixture 100. Also important is the orientation of electrical conductor 16 which must underlie tapping mechanisms 50 of the input and output circuits. The strip 16 may either be shorter than the length of test material 18 as seen in FIG. 1, or may be longer than the length of the test material 18, in which event it is necessary to ground strip 16. To this end, test fixture 100 includes conductive shorting lugs 162, 164 at each end of housing 12 for coupling extensions 166 of strip 16 therebetween so as to ground strip 16. Bottom grounding lug 162 is held against lower section 104 by bolt 168 passing through washer 170, and elongated slot 172 in lug 162 and threadably received in lower section 104. With bolt 168 loosened, lug 162 may be vertically adjusted so as to bring face 174 thereof level with the top of dielectric sheet 108 such that extension 166 of strip 16 will lie thereon. Bolt 168 is then tightened to hold lug 162 fast.

Upper lug 164 is similarly held against upper section 102 by a bolt 176 passing through washer 178, spring 180, elongated slot 182 in lug 164, and threadably received in upper section 102. Spring 180 keeps lug 164 against fixture 100 while lug 164 may be vertically adjusted such that when sections 102, 104 are clamped together, face 184 of lug 164 will mate with face 174 of lug 162 and capture extension 166 therebetween. To facilitate vertical adjustment of upper lug 164, bolts 185 are threadably received therein and through bores 186 in retaining wall 116 of upper section 102. Rotation of bolts 182 result in raising and lowering lug 164 while springs 188 between lug 164 and retaining wall 116 help hold face 174 of lug 164 level. Once lug 164 is adjusted, bolt 176 adjusts the spring pressure used to secure lug 164 in place.

In use of embodiment 100, sheet 108 is placed upon upper surface 110 of section 104 and strip 16 laid therein so that it will extend lengthwise between front and rear ends 116, 120 of the test fixture and is centered therein so as to underlie tapping mechanisms 50. Sheet 106 is then placed thereon and upper section 102 placed over section 104 with shoulders 130 in slots 132. Ground lugs 162, 164 are then positioned so faces 174, 184 grasp extension 166 to ground strip 16 for testing in the grounded mode. Alternately, if strip 16 is shorter than the length of sheets 106, 108, strip 16 will not be grounded for testing in the ungrounded mode. As shown in FIG. 4, ball bearing 160 is placed in indent 156 and anvil arm 152 of arbor press 150 is forced onto bearing 160 with at least 1000 lbs. force to forcibly mate sections 102 and 104 together and expel air pockets from the stripline. The force is maintained during testing.

Power sensors 46, 72 and meters 48, 74 are then connected to respective connectors 42 and source 40 connected to input circuit connector 36. Load 70 is connected to connector 36 of output circuit 26 (if a symmetrical system is desired). Testing as previously described is then conducted.

With reference to FIGS. 6–9, there is shown another embodiment 200 of test fixture 10 for testing dielectric material 18 in a coaxial configuration. To this end, housing 12 of embodiment 200 is a single aluminum block 202 with a bore milled therethrough to define cavity 14. Cavity 14 is circular in cross-section to retain therein a coaxial length of dielectric test material 18 surrounding element 16 which in this embodiment is a round electrical conductor extending axially through the coaxial length of test material. The test material with conductor 16 embedded therein is press fitted within cavity 14. Thus, it is preferred that cavity 14 of embodiment 200 be precisely machined to snugly receive the coaxial material therein such that air pockets within the cavity and/or between coaxial material sections and the conductor are eliminated.

If conductor 16 is to be grounded, copper grounding plates 228 are placed between retaining lugs 232, and secured against open ends of cavity 14 by bolts 236. Plates 228 have an opening 230 that is smaller in diameter than the diameter of conductor 16 so a portion of plates 228 contact conductor 16. Conductive bolt 236 with copper sleeve 238 is fastened into threaded bore 240 of conductor 16 so as to ground conductor 16 through plates 228 to housing 12. Testing may be conducted with neither end of conductor 16 grounded or both ends grounded.

While the present invention has been illustrated by the description of alternative embodiments, and while the embodiments have been described in considerable detail, it is not the intention of the applicant to restrict or any way limit the scope of the appended claims to such detail. Additional advantages and modifications will readily appear to those skilled in the art. For example, sections 102, 104 of embodiment 10 may be integrally formed with an access way (not shown) to cavity 14 rather than the separable sections as shown. Shoulder 130 and slots 132 could be eliminated such that cavity 14 in embodiment 100 is completely encircled by upper housing section 102. Similarly, embodiment 200 could have two separable sections rather than one integral block as described. The invention in its broadest aspects is therefore not limited to the specific details, representative apparatus and method, and illustrative examples shown and described. Accordingly, departures may be made from such details without departing from the spirit or scope of applicants general inventive concept.

What is claimed is:

1. A method for determining the dielectric properties of a material comprising:
   confining test material surrounding an electrical conductor within an electrically shielded cavity;
   coupling microwave energy into a center conductor at one end of a transmission line spaced from the cavity;
   coupling microwave energy from a tap member electrically connected to the center conductor and into the cavity at a first location, the first location being coincident a first portion of the electrical conductor in the cavity;
   moving the tap member relative the cavity to vary the spacing therebetween without removing the test material and surrounded electrical conductor from the cavity;
   measuring microwave energy at the tap member; and
   measuring microwave energy from a second location in the cavity, the second location being remote from the first location and coincident with a second portion of the electrical conductor in the cavity.

2. The method of claim 1 wherein the tap member includes a screw, the method further comprising:
   threadably mounting the screw in the center conductor with its distal end directed towards the cavity such that rotation of the screw moves the distal end towards and away from the cavity to vary coupling between the center conductor and the cavity.

3. The method of claim 1 further comprising:
   coupling microwave energy from the second location into a second tap member which is electrically connected to the center conductor of a second transmission line spaced from the cavity; and
   moving the second tap member relative the cavity to vary the spacing therebetween without removing the test material and surrounded electrical conductor from the cavity.

4. The method of claim 1 further comprising grounding the electrical conductor in the cavity.

5. A method for determining the dielectric properties of a material comprising:
   confining test material surrounding an electrical conductor within an electrically shielded cavity;
   coupling microwave energy into a center conductor at one end of a first transmission line spaced from the cavity and extending transversely the electrical conductor confined in the cavity;
   coupling microwave energy from a first tap member electrically connected to the center conductor of the first transmission line into the cavity at a first location, the first location being coincident a first portion of the electrical conductor in the cavity;

measuring the power of the microwave energy coupled from the first tap member with first power measuring equipment having a characteristic impedance to render the first transmission line flat between the first tap member and the first power measuring equipment;

coupling microwave energy from the cavity at a second location to a second tap member electrically connected to a center conductor in a second transmission line spaced from the cavity and extending transversely the electrical conductor confined in the cavity, the second location being remote from the first location and coincident with a second portion of the electrical conductor;

measuring the power of the microwave energy coupled into the second tap member with second power measuring equipment having a characteristic impedance to render the second transmission line flat between the second tap member and the second power measuring equipment; and moving the first and second tap members relative the cavity to vary the spacing between the member and the cavity until at least a predetermined difference is obtained between the measured power of the microwave energy coupled from the first tap member and the measured power of the microwave energy coupled into the second tap member.

6. The method of claim 5, said predetermined difference being at least about 40 db.

7. The method of claim 5 wherein the tap members are being moved substantially simultaneously.

8. The method of claim 5 wherein the tap members are being moved in approximately equal amounts.

9. A method for determining the dielectric properties of a material comprising:

confining test material surrounding an electrical conductor within an electrically shielded cavity;

coupling microwave energy into a center conductor at one end of a transmission line spaced from the cavity and extending transversely the electrical conductor in the cavity such that said center conductor is spaced from said cavity;

measuring microwave energy with power measuring equipment coupled to the center conductor at another end of the transmission line;

coupling microwave energy from a tap of the center conductor between the ends of the transmission line and into the cavity at a first location, said first location being coincident a first portion of the electrical conductor in the cavity, the power measuring equipment having a characteristic impedance to render the transmission line flat between the tap of the center conductor and the other end of the transmission line;

measuring microwave energy from a second location in the cavity, said second location being remote from said first location and coincident a second portion of the electrical conductor in the cavity.

10. The method of claim 9 wherein the microwave energy is capacitively coupled from the center conductor to the first location, the method further comprising varying the capacitance between the center conductor and the cavity whereby to vary the amount of microwave energy coupled from the center conductor into the cavity at the first location without removing the test material and surrounded electrical conductor from the cavity.

11. The method of claim 10 further comprising grounding the electrical conductor in the cavity.

* * * * *

UNITED STATES PATENT AND TRADEMARK OFFICE
CERTIFICATE OF CORRECTION

PATENT NO. : 5,083,088
DATED : January 21, 1992
INVENTOR(S) : Alexander B. Bereskin It is certified that error appears in the above-identified patent and that said Letters Patent is hereby corrected as shown below:

ABSTRACT   Line 1, "method" should be --fixture--.

ABSTRACT   Line 2, "using" should be --having--.

Col. 5, Line 44, "$\alpha_3$" should be --$\alpha_d$--.

Signed and Sealed this

Twenty-eighth Day of September, 1993

Attest:

BRUCE LEHMAN

*Attesting Officer*          *Commissioner of Patents and Trademarks*